United States Patent
Lee (10) Patent No.: US 8,149,608 B2
(45) Date of Patent: Apr. 3, 2012

(54) MULTI-LEVEL PHASE CHANGE RANDOM ACCESS MEMORY DEVICE

(75) Inventor: Tae-Yon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 253 days.

(21) Appl. No.: 12/459,155

(22) Filed: Jun. 26, 2009

(65) Prior Publication Data

US 2010/0012913 A1     Jan. 21, 2010

(30) Foreign Application Priority Data

Jul. 18, 2008  (KR) .................. 10-2008-0070166

(51) Int. Cl.
*G11C 11/00* (2006.01)
(52) U.S. Cl. .......................... 365/148; 365/163; 257/2
(58) Field of Classification Search .................. 365/148, 365/163, 189.09, 218, 230.06, 203, 189.15; 257/2
See application file for complete search history.

(56) References Cited

U.S. PATENT DOCUMENTS

| | | | | |
|---|---|---|---|---|
| 7,564,710 | B2 * | 7/2009 | Happ et al. .................. | 365/163 |
| 7,696,077 | B2 * | 4/2010 | Liu .............................. | 438/597 |
| 2007/0072125 | A1 * | 3/2007 | Sousa et al. .............. | 430/270.13 |
| 2008/0014733 | A1 | 1/2008 | Liu | |
| 2008/0185568 | A1 * | 8/2008 | Kwon et al. .................. | 257/2 |
| 2008/0247226 | A1 * | 10/2008 | Liu et al. .................. | 365/163 |
| 2009/0321706 | A1 * | 12/2009 | Happ et al. .................. | 257/4 |
| 2010/0061132 | A1 * | 3/2010 | Fujisaki et al. ............. | 365/51 |
| 2010/0188877 | A1 * | 7/2010 | Hanzawa et al. ........... | 365/63 |

OTHER PUBLICATIONS

Korean Patent Publication No. 1020070072779 to Jeong et al., having Publication date of Jul. 5, 2007 (w/ English Abstract page).
Korean Patent Publication No. 1020070073455 to Suh, having Publication date of Jul. 10, 2007 (w/ English Abstract page).
Japanese Patent Publication No. 2006-108645 to Li et al., having Publication date of Apr. 20, 2006 (w/ English Abstract page).

* cited by examiner

*Primary Examiner* — Dang Nguyen
(74) *Attorney, Agent, or Firm* — Monica H. Choi (57) ABSTRACT

A multi-level phase change random access memory device includes a first electrode, a second electrode, and a phase change material disposed between the first electrode and the second electrode. The multi-level phase change random access memory device also includes a variable bias source coupled to the first electrode. The variable bias source provides a respective bias applied at the first electrode to form a portion of the phase change material to have one of an amorphous state and different crystal states for storing multi-bits data.

20 Claims, 5 Drawing Sheets

MULTI-LEVEL PHASE CHANGE RANDOM ACCESS MEMORY DEVICE

This application claims priority under 35 USC §119 to Korean Patent Application No. 10-2008-0070166, filed on Jul. 18, 2008 in the Korean Intellectual Property Office, the disclosure of which is incorporated herein in its entirety by reference.

BACKGROUND OF THE INVENTION

1. Field of the Invention

The present invention relates generally to semiconductor random access memory devices, and more particularly to a multi-level phase change random access memory device with each storage node storing multiple bits.

2. Background of the Invention

A phase change random access memory (PRAM) device is a kind of non-volatile memory device, similar to a flash memory device, a ferroelectric random access memory (FeRAM) device, and a magnetic random access memory (MRAM) device. The PRAM device uses a phase change material as a data storage layer with a difference between the resistances of an amorphous phase and a crystalline phase of the phase change material indicating a state of a data bit.

For example, a conventional phase change material, such as a Ge—Sb—Te-based material, has a much higher resistance in an amorphous phase than in a crystalline phase. A phase transformation between such amorphous and crystalline phases is performed by Joule heating generated by a current conducted through the phase change material.

For example, when a predetermined voltage is applied to the phase change material for a short period of time, a portion of the phase change material is heated above a crystallization temperature and then is rapidly cooled to be in an amorphous state. Alternatively, when the predetermined voltage is applied to the phase change material in the amorphous state for a relatively long period of time, the phase change material is transformed back into the crystalline phase.

In the conventional PRAM device, the phase transformation from the amorphous phase to the crystalline phase is defined as a set operation, and the applied voltage used for such a transformation is referred to as a set voltage. Conversely, the phase transformation from the crystalline phase to the amorphous phase is defined as a reset operation, and the applied voltage used for such a transformation is referred to as a reset voltage.

However, a phase change material in the conventional PRAM device is in only a single set state and a single reset state with the phase change material layer storing only the two possible states of 1-bit data.

SUMMARY OF THE INVENTION

In aspects of the present invention, a phase change memory device includes a phase change material that is capable of transforming between more than two possible states for storing multi-bit data.

A multi-level phase change random access memory device according to an aspect of the present invention includes a first electrode, a second electrode, and a phase change material disposed between the first electrode and the second electrode. The multi-level phase change random access memory device also includes a variable bias source coupled to the first electrode. The variable bias source provides a respective bias applied at the first electrode to form a portion of the phase change material to have one of an amorphous state and at least two different crystal states.

In an example embodiment of the present invention, only the portion of the phase change material that abuts the first electrode makes a polymorphic phase transformation between any two of the reset and different crystal states.

In another embodiment of the present invention, the amorphous state and the different crystal states form a total number of states expressed as $2^n$ with n being an integer that is at least two. In that case, the total number of states represents possible bit patterns of n data bits. In addition, the variable bias source generates a respective voltage applied for a respective time period on the first electrode depending on a bit pattern of the n data bits.

In a further embodiment of the present invention, the amorphous state is for a reset state, and the different crystal states are for multiple set states.

In another embodiment of the present invention, the portion of the phase change material makes a polymorphic phase transformation between any two of the reset and different crystal states.

In a further embodiment of the present invention, the phase change material has different respective resistances in the reset and different crystal states. For example, the respective resistances of the reset and different crystal states differ from each-other by at least a factor of 10.

In an example embodiment of the present invention, the phase change material is comprised of one of $Ag_{10}Te_4Br_3$ and $In_2Se_3$.

A multi-level phase change random access memory device according to another aspect of the present invention includes a first electrode, a second electrode, and a phase change material disposed between the first electrode and the second electrode. In addition, the multi-level phase change random access memory device further includes a variable bias source coupled to the first electrode and a voltage source controller that controls the variable bias source to provide different respective biases applied at the first electrode for different bit patterns of at least two data bits. In addition, a constant bias is applied at the second electrode for the different bit patterns.

In an example embodiment of the present invention, a portion of the phase change material is biased to have a respective one of an amorphous state and at least two different crystal states for each bit pattern. For example, only the portion of the phase change material that abuts the first electrode makes a polymorphic phase transformation between any two of the reset and different crystal states.

In this manner, the phase change material stores multi bit information. Such multi bit information is erased/programmed when the phase change material makes the polymorphic phase transformation between any two of the reset and different crystal states.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4A, 4B, 4C, 4D, 5, and 6 refer to elements having similar structure and/or function.

DETAILED DESCRIPTION OF THE INVENTION

The present invention is now described more fully with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the concepts of the invention to one skilled in the art. In the drawings, like reference numerals denote like elements, and the sizes and thicknesses of layers and regions are exaggerated for clarity.

Figure 1:
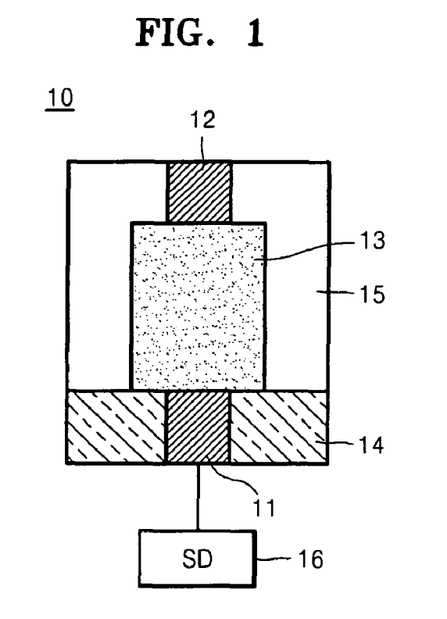
FIG. 1 is a cross-sectional view of a memory cell of a multi-level phase change random access memory device according to an embodiment of the present invention.
Figure 5:
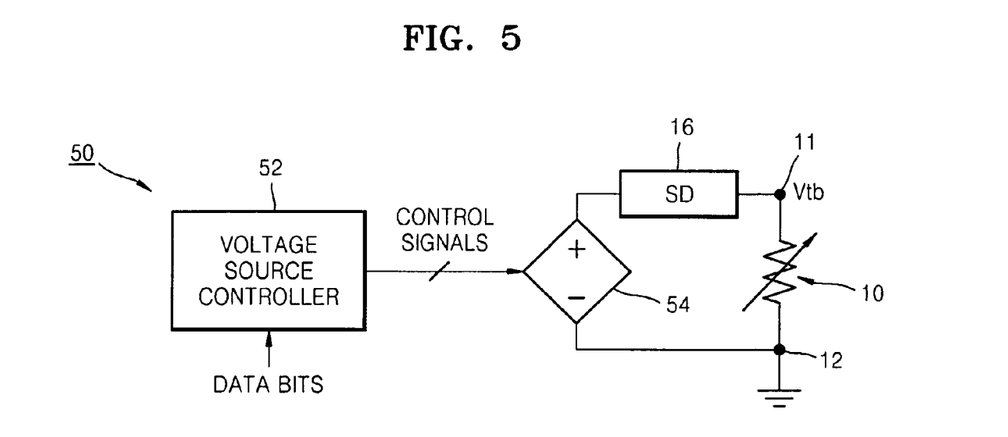
FIG. 5 shows a block diagram of additional components of the multi-level phase change random access memory device for operation of the memory cell of FIG. 1, according to an embodiment of the present invention.

FIG. 1 shows a cross-sectional view of a memory cell 10 of a multi-level phase change random access memory device 50 of FIG. 5, according to an embodiment of the present invention. Referring to FIG. 1, the memory cell 10 includes a first electrode 11, a second electrode 12, and a phase change material 13 disposed between the first and second electrodes 11 and 12.

As illustrated in FIG. 1, the first electrode 11 is a plug-type electrode disposed in a respective contact hole of a first interlayer insulating layer 14, according to an example embodiment of the present invention. The phase change material 13 is formed on the first interlayer insulating layer 14 and onto the first electrode 11 to be electrically connected to the first electrode 11. In addition, a second interlayer insulating layer 15 is formed on the first interlayer insulating layer 14 to surround the phase change material 13. The second electrode 12 is disposed in a respective contact hole formed in the second interlayer insulating layer 15 onto the phase change material 13 to be electrically connected to the phase change material 13.

The first electrode 11, the phase change material layer 13, and the second electrode 12 form a single storage node of the multi-level phase change random access memory device 50, according to an embodiment of the present invention. In addition, a switching device 16 is connected to the first electrode 11 of the memory cell 10. The present invention may also be practiced with the switching device 16 being connected to the second electrode 12 instead of the first electrode 11. The switching device 16 controls access to the storage node of the memory cell 10, and the switching device 16 may be a diode or a transistor, in an example embodiment of the present invention.

Although not illustrated in FIG. 1, another electrode having a width greater than that of the first electrode 11 may further be formed below the first electrode 11 to be electrically connected to the first electrode 11. Each memory cell 10 may be formed by the storage node comprised of the first and second electrodes 11 and 12 and the phase change material 13 and the switching device 16. A plurality of such memory cells 10 are configured as an array to form a multi-level phase change random access memory device according to an embodiment of the present invention.

Depending on a bias voltage applied between the first and second electrodes 11 and 12, a phase of the phase change material 13 is determined. A phase change material, such as $Ge_2Sb_2Te_5$, used in the conventional phase change random access memory devices has only two phases: an amorphous phase and a crystalline phase for storing only 1-bit information. For example, the amorphous phase indicates a logic low state "0" of the 1-bit digital data while the crystalline phase indicates a logic high state "1" of the 1-bit digital data.

According to an embodiment of the present invention, the phase change material 13 is capable of being in at least three different phases with respective different resistances. In one embodiment of the present invention, the phase change material 13 is capable of being in an amorphous state and at least two different crystal states. For example, a total number of such amorphous and different crystal states is expressed as $2^n$ with n being an integer that is at least two.

In that case, the total number of such amorphous and different crystal states may be used to represent $2^n$ possible bit patterns of n data bits. For example, when the phase change material 13 is capable of being in a total number of four=$2^2$, (i.e., n=2) amorphous or different crystal states, such four states are used to represent the four different bit patterns "00", "01", "10", and "11" of n=2 data bits. Thus, the storage node comprised of the first and second electrodes 11 and 12 and the phase change material 13 stores 2-bit information. Similarly, if the phase change material 13 were capable of being in eight different amorphous or crystal states, such storage node would store 3-bit information.

According to an aspect of the present invention, the phase change material 13 is capable of being transformed into one of an amorphous state and three different crystal states. The phase change material 13 has different respective resistances in the amorphous and different crystal states. Such respective resistances are sufficiently different to ensure reliability of recording/reproducing in the multi-level phase change random access memory device. For example, the respective resistances of the phase change material 13 in the amorphous and different crystal states differ from each other by a factor of at least ten.

In addition, the phase change material 13 undergoes polymorphic phase transformation between any two of such amorphous and different crystal states such that even with repeated transformation between such states, the phase change material 13 is not significantly degraded. In an example embodiment of the present invention, the phase change material 13 is comprised of one of $Ag_{10}Te_4Br_3$ and $In_2Se_3$, or the like.

Figure 2:
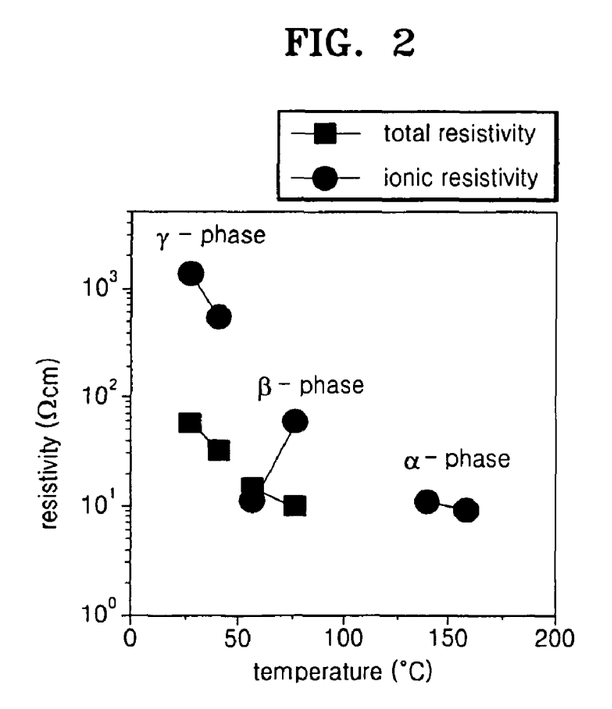
FIG. 2 illustrates a resistivity characteristic of a phase change material of FIG. 1, according to an embodiment of the present invention.

For example, FIG. 2 shows a resistivity characteristic of $Ag_{10}Te_4Br_3$ that may be used for the phase change material 13 of FIG. 1. $Ag_{10}Te_4Br_3$ has three different crystal phases (i.e., three different crystal states) of $\alpha$, $\beta$, and $\gamma$, according to crystallization temperature. FIG. 2 shows different respective temperature ranges for setting the $Ag_{10}Te_4Br_3$ phase change material into the different crystal states $\alpha$, $\beta$, and $\gamma$. In addition, FIG. 2 shows significantly different respective resistance ranges for the $Ag_{10}Te_4Br_3$ phase change material being in the different crystal states $\alpha$, $\beta$, and $\gamma$.

For example, the $\alpha$-$Ag_{10}Te_4Br_3$ crystal state is formed at about 150° C. and has a respective resistivity of about 10. In addition, the $\beta$-$Ag_{10}Te_4Br_3$ crystal state is formed at about 80° C. and has a respective resistivity of about $10^2$. Furthermore, the $\gamma$-$Ag_{10}Te_4Br_3$ crystal state is formed at about 40° C. and has a respective resistivity of about $10^3$. Although the amorphous state of $Ag_{10}Te_4Br_3$ is not shown in FIG. 2, the $Ag_{10}Te_4Br_3$ amorphous state has a respective resistivity that is significantly greater (such as about 10-times higher) than the $\gamma$-$Ag_{10}Te_4Br_3$ crystal state.

Accordingly, the amorphous and different crystal states of $Ag_{10}Te_4Br_3$ have respective resistances that differ from each-other by at least a factor of ten. Such different resistances indicate the four different bit patterns "00", "01", "10", and "11" of the 2-bits data for reliable data recording/reproducing. Another words, the phase change material 13 is ensured to be transformed into a desired one of the amorphous and different crystal states, and is ensured to be recognized as representing a desired one of the different possible bit patterns. In addition, $Ag_{10}Te_4Br_3$ is amenable to polymorphic phase transformation between the amorphous and different crystal states for minimized degradation of the phase change material 13 even with repeated transformations.

Figure 3:
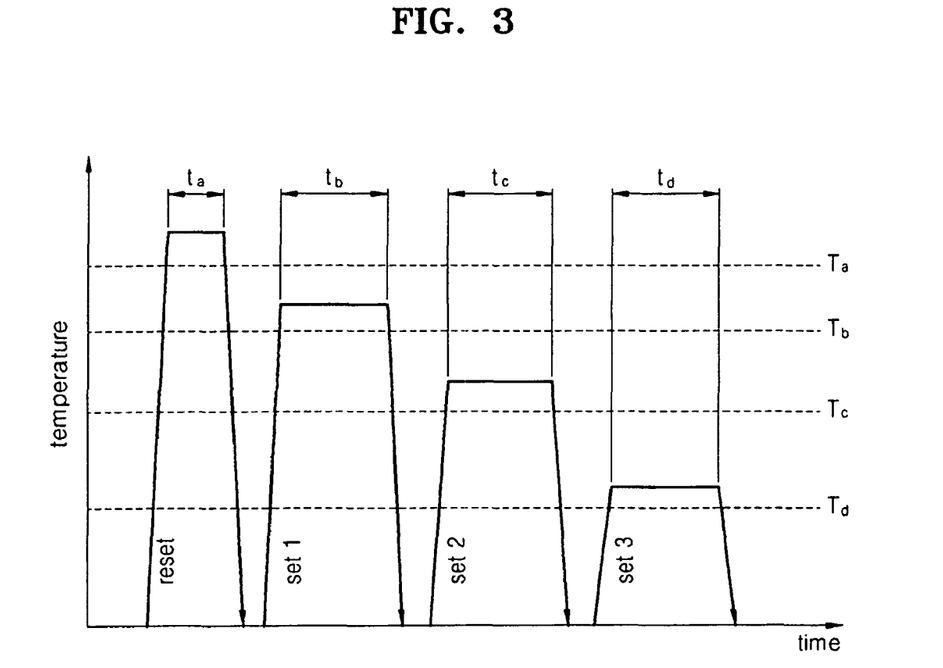
FIG. 3 illustrates respective temperatures and respective time periods for heating the phase change material of FIG. 2 for performing polymorphic phase transformations between any two of the amorphous and different crystal states, according to an embodiment of the present invention.

FIG. 3 illustrates respective temperatures and respective time periods for heating the phase change material of FIG. 2 for performing polymorphic phase transformations between any two of the amorphous and different crystal states, according to an embodiment of the present invention. FIGS. 4A, 4B, 4C, and 4D are cross-sectional views of the memory cell 10 of FIG. 1 for each of the amorphous and different crystal states, according to an embodiment of the present invention.

FIG. 5 shows additional components of the multi-level phase change memory device 50 for performing polymorphic phase transformations between any two of the amorphous and different crystal states of the memory cell 10. The multi-level phase change memory device 50 includes a voltage source controller 52 and a variable voltage source 54.

Figure 6:
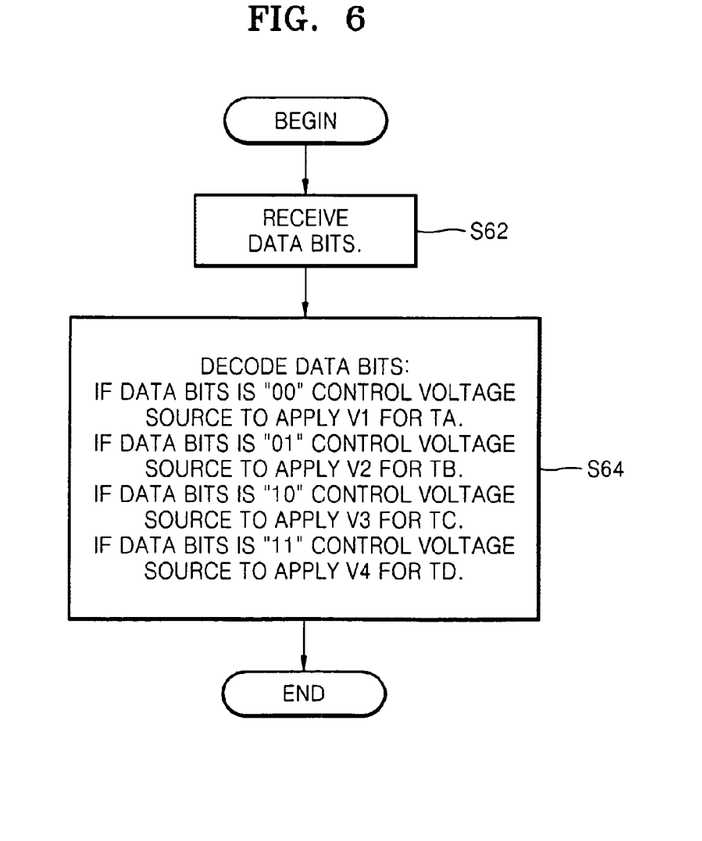
FIG. 6 shows a flow-chart of steps during operation of the components of FIG. 5, according to an embodiment of the present invention.

The voltage source controller 52 receives the 2-bits data to generate control signals for controlling the variable voltage source 54 according to such received 2-bits data. The variable voltage source 54 generates a variable bias voltage $V_{bt}$ applied at the first electrode 11 through the switching device 16. The variable voltage source 54 generates the variable bias voltage according to the control signals from the voltage source controller 52. FIG. 6 shows a flow-chart of steps during operation of the components of FIG. 5 for performing polymorphic phase transformations between any two of the amorphous and different crystal states of the memory cell 10, according to an embodiment of the present invention.

Referring to FIGS. 3, 4A, 5, and 6, the voltage source controller 52 receives the 2-bits data (step S62 of FIG. 6) to be stored by the phase change material 13 and decodes such bits. Depending on the bit pattern of such received bits, the voltage source controller 52 controls the variable voltage source 54 to generate a respective bias voltage to be applied on the first electrode 11 (step S64 of FIG. 6).

For example, assume that a predetermined bit pattern such as "00" for example is represented by an amorphous (i.e., reset) state of the phase change material 13. In that case, when the voltage source controller 52 receives "00" for storage by the phase change material 13, the voltage source controller 52 controls the variable voltage source 54 to generate a first voltage $V_1$ applied at the first electrode 11 through the switching device 16 for a first time period $t_a$. In an example embodiment of the present invention, a constant bias voltage (such as a ground voltage for example) is applied at the second electrode 12 during the transformations of FIGS. 4A, 4B, 4C, and 4D.

Figure 4A:
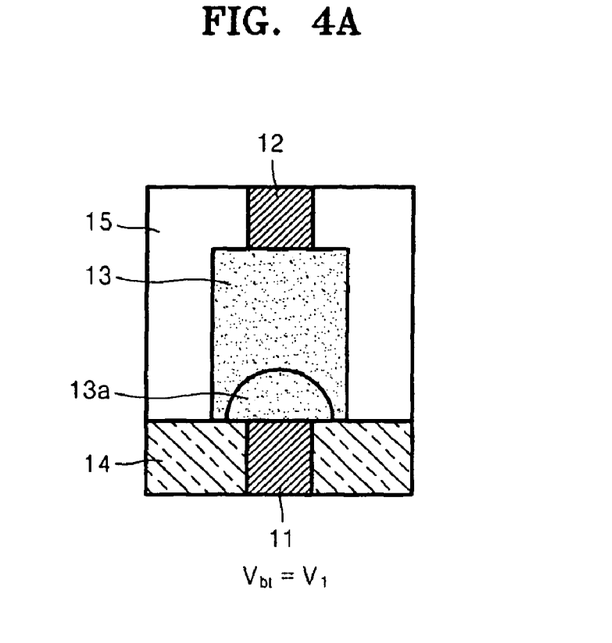
FIGS. 4A, 4B, 4C, and 4D are cross-sectional views of the memory cell of FIG. 1 for each of the amorphous and different crystal states, according to an embodiment of the present invention.

Accordingly in FIGS. 3 and 4A, a portion 13a of the phase change material 13 is heated to a temperature above a melting point $T_a$ of the phase change material 13 for the first time period $t_a$ and is subsequently quenched rapidly to be transformed into the amorphous phase. The portion 13a of the phase change material 13 that is transformed into the amorphous phase in FIG. 4A abuts the first electrode 11 but does not abut the second electrode 12, in an example embodiment of the present invention. After such transformation of FIG. 4A, the phase change material 13 in the amorphous state has a respective resistance of $\rho_a$.

Alternatively referring to FIGS. 3, 4B, 5, and 6, assume that a predetermined bit pattern such as "01" for example is represented by an $\alpha$-crystal state (i.e., a first set) state of the phase change material 13. In that case, when the voltage source controller 52 receives "01" for storage by the phase change material 13, the voltage source controller 52 controls the variable voltage source 54 to generate a second voltage $V_2$ applied at the first electrode 11 through the switching device 16 for a second time period $t_b$.

Figure 4B:
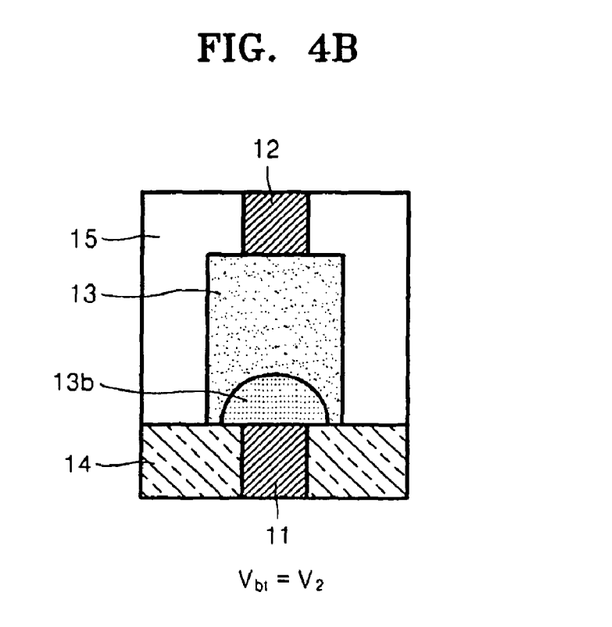

Accordingly in FIGS. 3 and 4B, a portion 13b of the phase change material 13 is heated to a temperature above a first crystal phase change temperature $T_b$ for the second time period $t_b$ and is subsequently quenched rapidly to be transformed into the $\alpha$-crystal state. The portion 13b of the phase change material 13 that is transformed into the $\alpha$-crystal state in FIG. 4B abuts the first electrode 11 but does not abut the second electrode 12, in an example embodiment of the present invention. After such transformation of FIG. 4B, the phase change material 13 in the $\alpha$-crystal state has a respective resistance of $\rho_b$.

Also referring to FIGS. 3, 4C, 5, and 6, assume that a predetermined bit pattern such as "10" for example is represented by a $\beta$-crystal state (i.e., a second set) state of the phase change material 13. In that case, when the voltage source controller 52 receives "10" for storage by the phase change material 13, the voltage source controller 52 controls the variable voltage source 54 to generate a third voltage $V_3$ applied at the first electrode 11 through the switching device 16 for a third time period $t_c$.

Figure 4C:
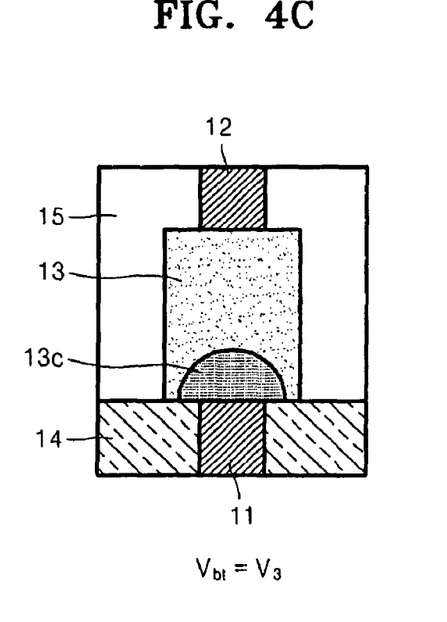

Accordingly in FIGS. 3 and 4C, a portion 13c of the phase change material 13 is heated to a temperature above a second crystal phase change temperature $T_c$ for the third time period $t_c$ and is subsequently quenched rapidly to be transformed into the $\beta$-crystal state. The portion 13c of the phase change material 13 that is transformed into the $\beta$-crystal state in FIG. 4C abuts the first electrode 11 but does not abut the second electrode 12, in an example embodiment of the present invention. After such transformation of FIG. 4C, the phase change material 13 in the $\beta$-crystal state has a respective resistance of $\rho_c$.

Further referring to FIGS. 3, 4D, 5, and 6, assume that a predetermined bit pattern such as "11" for example is represented by a $\beta$-crystal state (i.e., a third set) state of the phase change material 13. In that case, when the voltage source controller 52 receives "11" for storage by the phase change material 13, the voltage source controller 52 controls the variable voltage source 54 to generate a fourth voltage $V_4$ applied at the first electrode 11 through the switching device 16 for a third time period $t_d$.

Figure 4D:
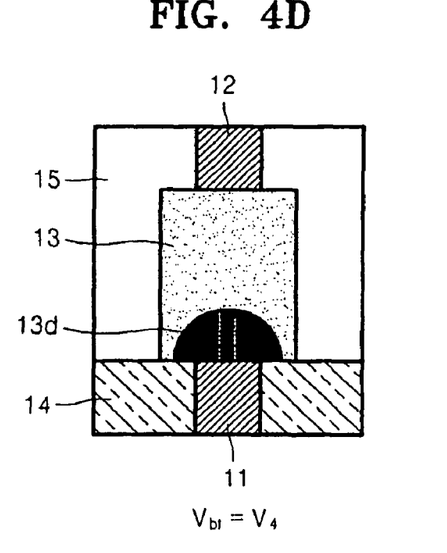

Accordingly in FIGS. 3 and 4D, a portion 13d of the phase change material 13 is heated to a temperature above a third crystal phase change temperature $T_d$ for the fourth time period $t_d$ and is subsequently quenched rapidly to be transformed into the γ-crystal state. The portion 13d of the phase change material 13 that is transformed into the γ-crystal state in FIG. 4D abuts the first electrode 11 but does not abut the second electrode 12, in an example embodiment of the present invention. After such transformation of FIG. 4D, the phase change material 13 in the γ-crystal state has a respective resistance of $\rho_d$.

In an embodiment of the present invention, the respective phase change temperatures for the amorphous and different crystal states satisfies an inequality of $T_a > T_b > T_c > T_d$. Furthermore, the resistances of the phase change material 13 in the amorphous and different crystal states satisfies an inequality of $\rho_a > \rho_b > \rho_c > \rho_d$. In addition, the respective bias voltages applied to the first electrode 11 for the amorphous and different crystal states satisfies an inequality of $V_1 > V_2 > V_3 > V_4$.

For simplicity of illustration and description in FIGS. 4A, 4B, 4C, and 4D, transformation of the phase change material 13 is described through the amorphous state and the α, β, and γ-crystal states. However, the phase change material 13 may be transformed between any two of the amorphous state and the α, β, and γ-crystal states. For example, the "01" bits data stored with the phase change material 13 may be directly changed to the "11" bits data by applying the voltage $V_4$ to the first electrode 11 for the time period $t_d$.

Furthermore, the data stored by the phase change material 13 may be read out by supplying a low current between the first and second electrodes 11 and 12 that maintains a temperature of the phase change material layer 13 to be lower than the lowest phase change temperature $T_d$ in FIG. 3. The resistance of the phase change material 13 is determined for indicating the 2-bits data stored by the phase change material 13.

While the present invention has been shown and described with reference to exemplary embodiments thereof, it will be understood by those of ordinary skill in the art that various changes in form and detail may be made herein without departing from the spirit and scope of the present invention, as defined by the following claims.

The present invention is limited only as defined in the following claims and equivalents thereof.

What is claimed is:

1. A multi-level phase change random access memory device comprising:
    a first electrode;
    a second electrode;
    a phase change material disposed between the first electrode and the second electrode; and
    a variable bias source coupled to the first electrode,
    wherein the variable bias source provides a respective bias applied at the first electrode to control a portion of the phase change material to have one of an amorphous state and at least two different crystal phases from respective polymorphic phase transformations,
    and wherein said different crystal phases are polymorphic phase transformations with different ionic resistivities from each-other such that said phase change material does not have any portion with a same ionic resistivity in said different crystal phases.

2. The multi-level phase change random access memory device of claim 1, wherein only said same portion of the phase change material that abuts the first electrode makes a polymorphic phase transformation between any two of said amorphous state and said different crystal phases, and wherein another portion of the phase change material that is not changed during any of the amorphous state and the different crystal phases remains to abut the second electrode.

3. The multi-level phase change random access memory device of claim 1, wherein the amorphous state and the different crystal phases form a total number of states expressed as $2^n$ with n being an integer that is at least two.

4. The multi-level phase change random access memory device of claim 3, wherein the total number of states represents possible bit patterns of n data bits.

5. The multi-level phase change random access memory device of claim 4, wherein the variable bias source generates a respective voltage applied for a respective time period on the first electrode depending on a bit pattern of the n data bits.

6. The multi-level phase change random access memory device of claim 1, wherein the amorphous state is for a reset state, and wherein the different crystal phases are for multiple set states.

7. The multi-level phase change random access memory device of claim 1, wherein the portion of the phase change material makes a respective polymorphic phase transformation between any two of the amorphous state and the different crystal phases.

8. The multi-level phase change random access memory device of claim 1, wherein the phase change material has different respective resistances in the amorphous state and the different crystal phases.

9. The multi-level phase change random access memory device of claim 8, wherein the respective resistances of the amorphous state and the different crystal phases differ from each-other by at least a factor of 10.

10. The multi-level phase change random access memory device of claim 8, wherein the phase change material is comprised of silver (Ag) and Bromine (Br).

11. A multi-level phase change random access memory device comprising:
    a first electrode;
    a second electrode;
    a phase change material disposed between the first electrode and the second electrode;
    a variable bias source coupled to the first electrode; and
    a voltage source controller that controls the variable bias source to provide different respective biases applied at the first electrode for different bit patterns of at least two data bits to control a portion of the phase change material to have one of an amorphous state and at least two different crystal phases from respective polymorphic phase transformations,
    wherein a constant bias is applied at the second electrode for the different bit patterns
    and wherein said different crystal phases are polymorphic phase transformations with different ionic resistivities from each-other such that said phase change material does not have any portion with a same ionic resistivity in said different crystal phases.

12. The multi-level phase change random access memory device of claim 11, wherein only said same portion of the phase change material is biased to have a respective one of said amorphous state and said at least two different crystal phases for each bit pattern, and wherein another portion of the phase change material that is not changed during any of the amorphous state and the different crystal phases remains to abut the second electrode.

13. The multi-level phase change random access memory device of claim 12, wherein only said same portion of the phase change material that abuts the first electrode makes a polymorphic phase transformation between any two of said amorphous state and the different crystal phases.

14. The multi-level phase change random access memory device of claim 12, wherein the amorphous state and the different crystal phases form a total number of states expressed as $2^n$ with n being an integer that is at least two.

15. The multi-level phase change random access memory device of claim 14, wherein the total number of states represents possible bit patterns of n data bits.

16. The multi-level phase change random access memory device of claim 15, wherein the variable bias source generates a respective voltage applied for a respective time period on the first electrode for each bit pattern of the n data bits.

17. The multi-level phase change random access memory device of claim 12, wherein the amorphous state is for a reset state, and wherein the different crystal phases are for multiple set states.

18. The multi-level phase change random access memory device of claim 12, wherein the portion of the phase change material makes a polymorphic phase transformation between any two of the amorphous state and the different crystal phases.

19. The multi-level phase change random access memory device of claim 12, wherein the phase change material has different respective resistances in the amorphous state and the different crystal phases, and wherein the respective resistances of the amorphous state and the different crystal phases differ from each-other by at least a factor of 10.

20. The multi-level phase change random access memory device of claim 19, wherein the phase change material is comprised of silver (Ag) and Bromine (Br).

* * * * *